(12) United States Patent
Mendoza et al.

(10) Patent No.: US 12,436,337 B2
(45) Date of Patent: Oct. 7, 2025

(54) LOW LOSS OPTICAL INTERPOSER

(71) Applicant: PsiQuantum, Corp., Palo Alto, CA (US)

(72) Inventors: Gabriel Joel Mendoza, Mountain View, CA (US); Khanh Tran, Milpitas, CA (US); Wenguang Li, Milpitas, CA (US); Vimal Kamineni, Fremont, CA (US); Mark Thompson, Chester (GB)

(73) Assignee: PsiQuantum, Corp., Palo Alto, CA (US)

( * ) Notice: Subject to any disclaimer, the term of this patent is extended or adjusted under 35 U.S.C. 154(b) by 0 days.

(21) Appl. No.: 19/112,878

(22) PCT Filed: Sep. 19, 2024

(86) PCT No.: PCT/US2024/047487
§ 371 (c)(1),
(2) Date: Mar. 18, 2025

(87) PCT Pub. No.: WO2025/064676
PCT Pub. Date: Mar. 27, 2025

(65) Prior Publication Data
US 2025/0258339 A1    Aug. 14, 2025

Related U.S. Application Data

(60) Provisional application No. 63/540,024, filed on Sep. 22, 2023.

(51) Int. Cl.
*G02B 6/132*   (2006.01)
*H10F 71/00*   (2025.01)

(52) U.S. Cl.
CPC .......... *G02B 6/132* (2013.01); *H10F 71/136* (2025.01); *H10F 71/139* (2025.01)

(58) Field of Classification Search
CPC .......... H01L 2224/16225; H01L 24/08; H01L 2224/80896; H01L 2224/08145;
(Continued)

(56) References Cited

U.S. PATENT DOCUMENTS 10,393,959 B1    8/2019    Razdan et al.
2016/0109655 A1  4/2016    Vurgaftman et al.
(Continued)

OTHER PUBLICATIONS

International Application Serial No. PCT/US2024/047487, International Search Report mailed Oct. 25, 2024, 3 pgs.
International Application Serial No. PCT/US2024/047487, Written Opinion mailed Oct. 25, 2024, 6 pgs.
N, Araki, et al., "Development of Micrometer-Thick Bonding Material for Wafer-on-Wafer (WOW) Applications", (2018), 4 pgs.
(Continued)

*Primary Examiner* — Earl N Taylor
(74) *Attorney, Agent, or Firm* — Schwegman Lundberg & Woessner, P.A.

(57) ABSTRACT

An optical interposer can be formed from multiple wafers, including a photonic integrated circuit wafer and an interposer wafer. The photonic integrated circuit wafer can be bonded to a rigid carrier structure, and material near waveguides can be removed such that the waveguides can be coupled to waveguides of the interposer. The photonic integrated circuit can be separated into multiple rigid dies which can be bonded to the interposer separately. Additional processing can be performed to form electrical connections to the rigid dies to form an ultra-low optical interposer.

16 Claims, 18 Drawing Sheets

(58) Field of Classification Search
CPC ....... H01L 25/167; H01L 24/80; H01L 25/18; H01L 25/16; G02B 6/12; G02B 6/132; H10F 71/136; H10F 71/139
See application file for complete search history.

(56) References Cited

U.S. PATENT DOCUMENTS

| | | |
|---|---|---|
| 2019/0227231 A1 | 7/2019 | Ring et al. |
| 2019/0324203 A1 | 10/2019 | Bayn et al. |
| 2020/0166720 A1* | 5/2020 | Charles ................ G02B 6/4245 |
| 2021/0157056 A1 | 5/2021 | Butler et al. |
| 2022/0099590 A1 | 3/2022 | Curtin |
| 2023/0244029 A1* | 8/2023 | Charles .................... G02B 6/43 385/14 |
| 2023/0366913 A1* | 11/2023 | Kamineni ........... H10F 77/1437 |
| 2024/0272388 A1* | 8/2024 | Li ........................ G02B 6/4243 |
| 2024/0329308 A1* | 10/2024 | Dasgupta ................ G02B 6/30 |

OTHER PUBLICATIONS

Naoko, Araki, et al., "Material Optimization of Permanent and Temporary Adhesives for Wafer-level Three-dimensional Integration", IEEE 70th Electronic Components and Technology Conference (ECTC), (2020), 6 pgs.

Y, S Kim, et al., "Electrical Characteristics of Bumpless Interconnects for Through Silicon via (TSV) and Wafer-on-Wafer (WOW) Integration", WOW Alliance, Tokyo Institute of Technology, 4259 Nagatsuda, Midori-ku, Yokohama 226-8503, Japan, (2016), 5 pgs.

Y, S Kim, et al., "Ultra Thinning down to 4-μm using 300-mm Wafer proven by 40-nm Node 2Gb DRAM for 3D Multi-stack WOW Applications", Symposium on VLSI Technology Digest of Technical Papers, (2014), 2 pgs.

Young, Suk Kim, et al., "Advanced wafer thinning technology and feasibility test for 3D integration", Microelectronic Engineering 107, (2013), 65-71.

* cited by examiner

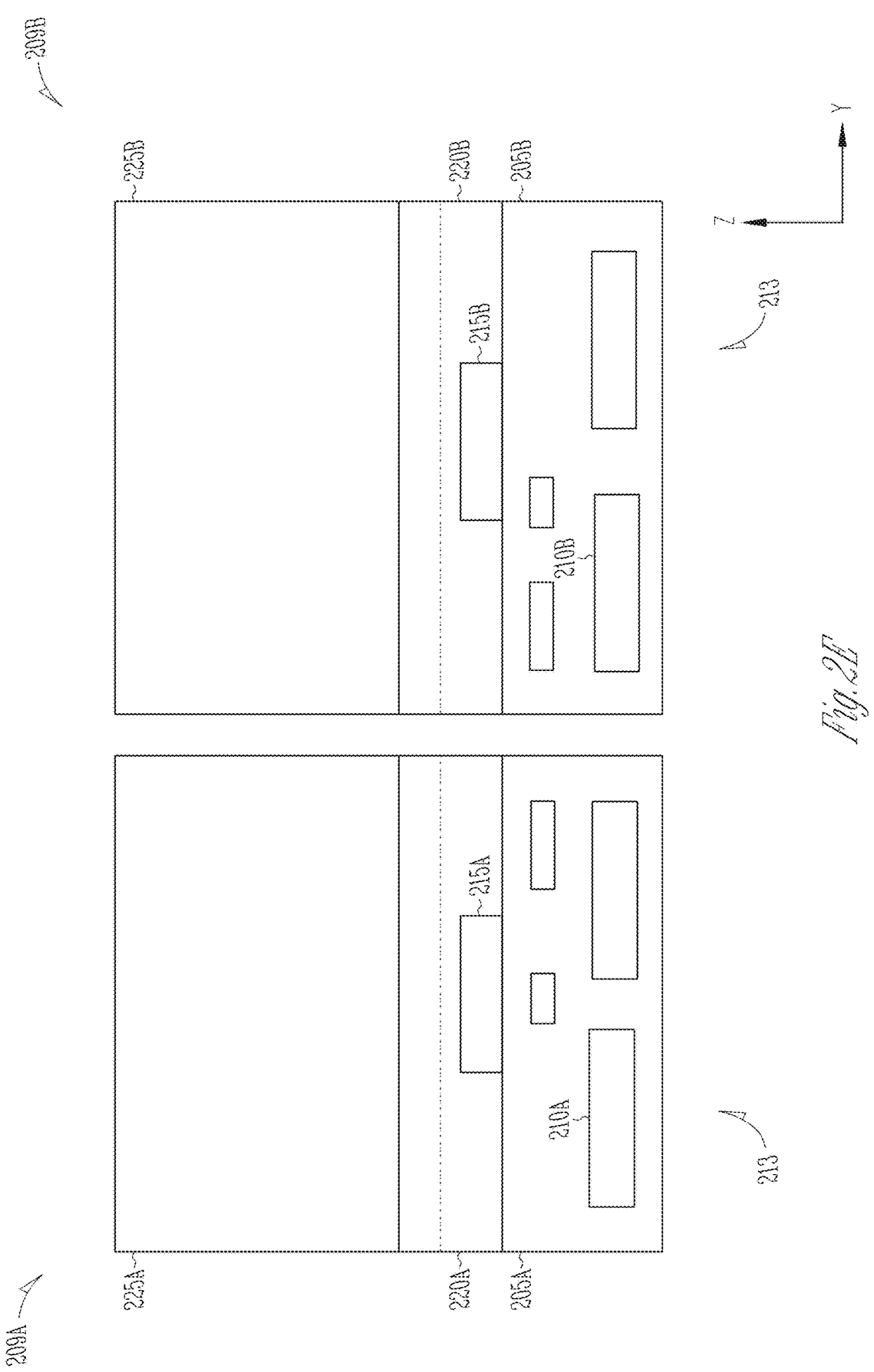

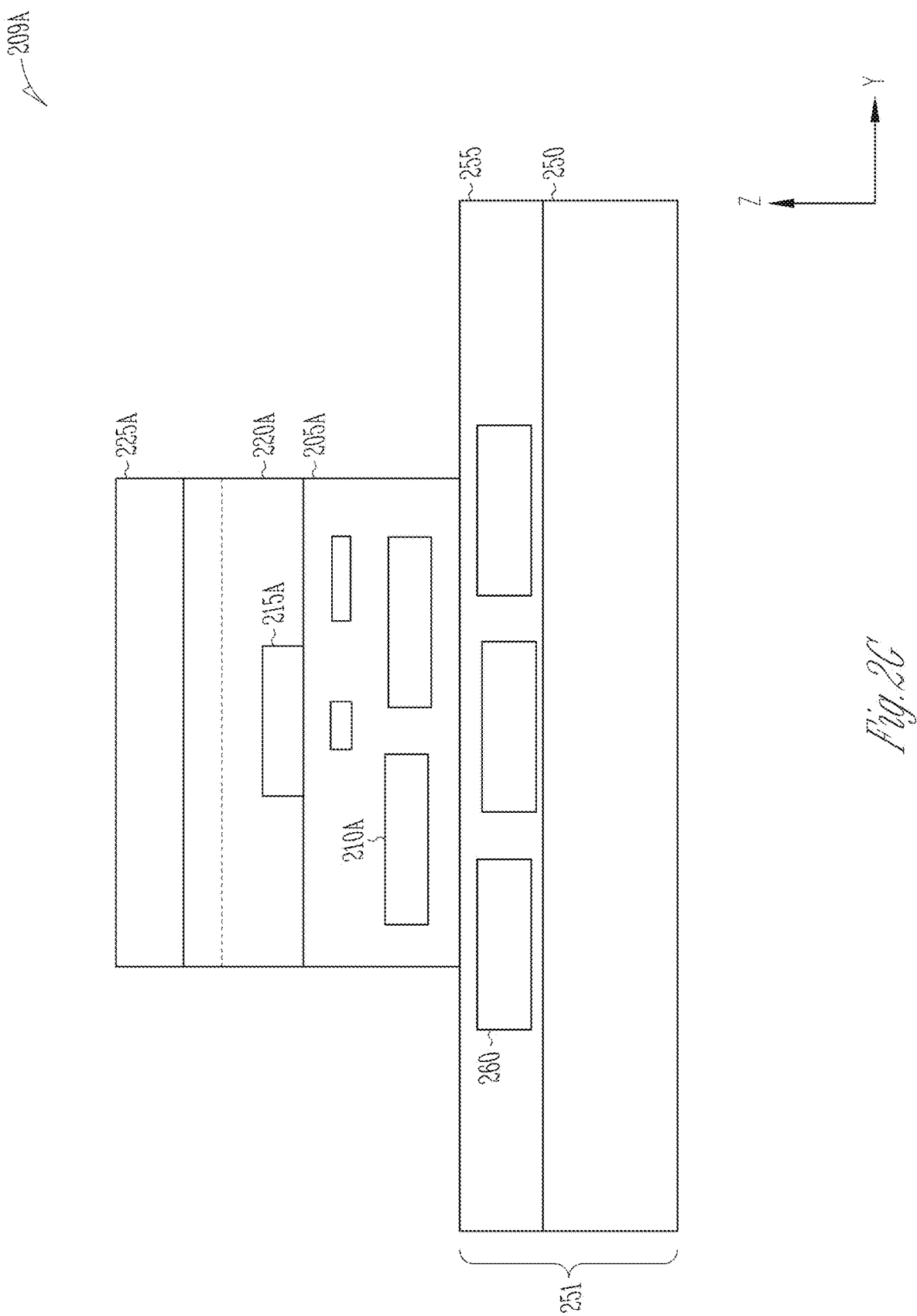

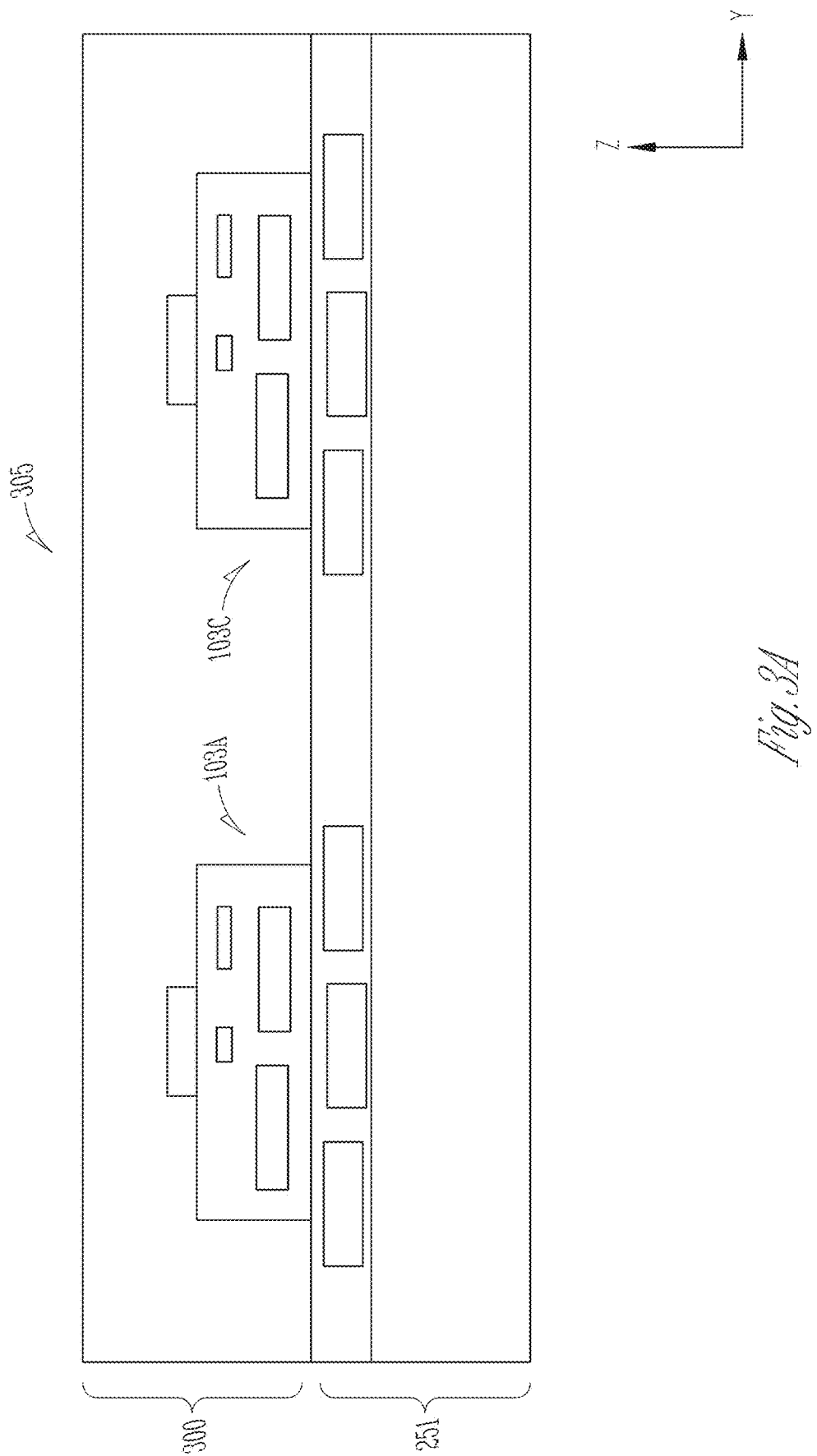

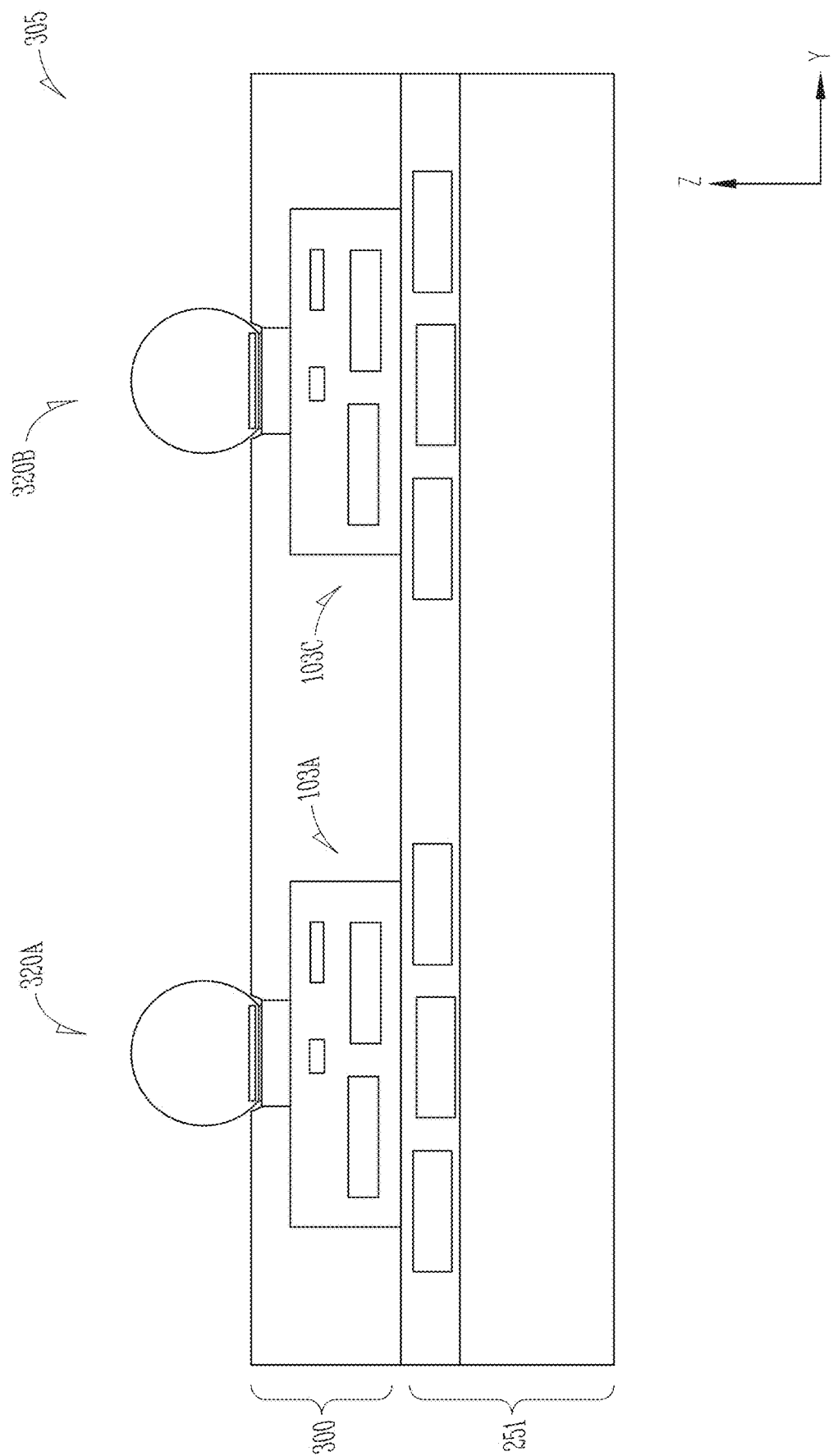

LOW LOSS OPTICAL INTERPOSER

CLAIM OF PRIORITY

This application is a U.S. national stage filing under 35 U.S.C. § 371 from International Application No. PCT/US2024/047487, filed on Sep. 19, 2024, which claims the benefit of priority to U.S. Patent Application Ser. No. 63/540,024, filed on Sep. 22, 2023, the benefit of priority of each of which is claimed herein and which applications and publication are hereby incorporated by reference herein in their entirety.

TECHNICAL FIELD

Embodiments of the disclosure relate generally to optical devices and, more specifically, to optical interposers.

BACKGROUND

Photonic integrated circuits (PICs) can perform optical information-based processing to perform computational tasks. To perform complex computational tasks, multiple PICs can be optically coupled together to complete the tasks in a distributed or networked manner. Modern high performance optical information processing systems, such as photonic based quantum computing and optical telecommunications systems, may require ultra-low loss connections between different optical devices, which can be difficult to implement.

BRIEF DESCRIPTION OF THE DRAWINGS

The present disclosure will be understood more fully from the detailed description given below and from the accompanying drawings of various embodiments of the disclosure.

FIGS. 2A-2H show examples for manufacturing of an interposer, in accordance with some example embodiments.

FIGS. 3A-3D show examples of fabrication approaches for combining an interposer with PIC chiplets, in accordance with some example embodiments.

Descriptions of certain details and implementations follow, including a description of the figures, which may depict some or all of the embodiments described below, as well as discussing other potential embodiments or implementations of the inventive concepts presented herein. An overview of embodiments of the disclosure is provided below, followed by a more detailed description with reference to the drawings.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Figure 1A:
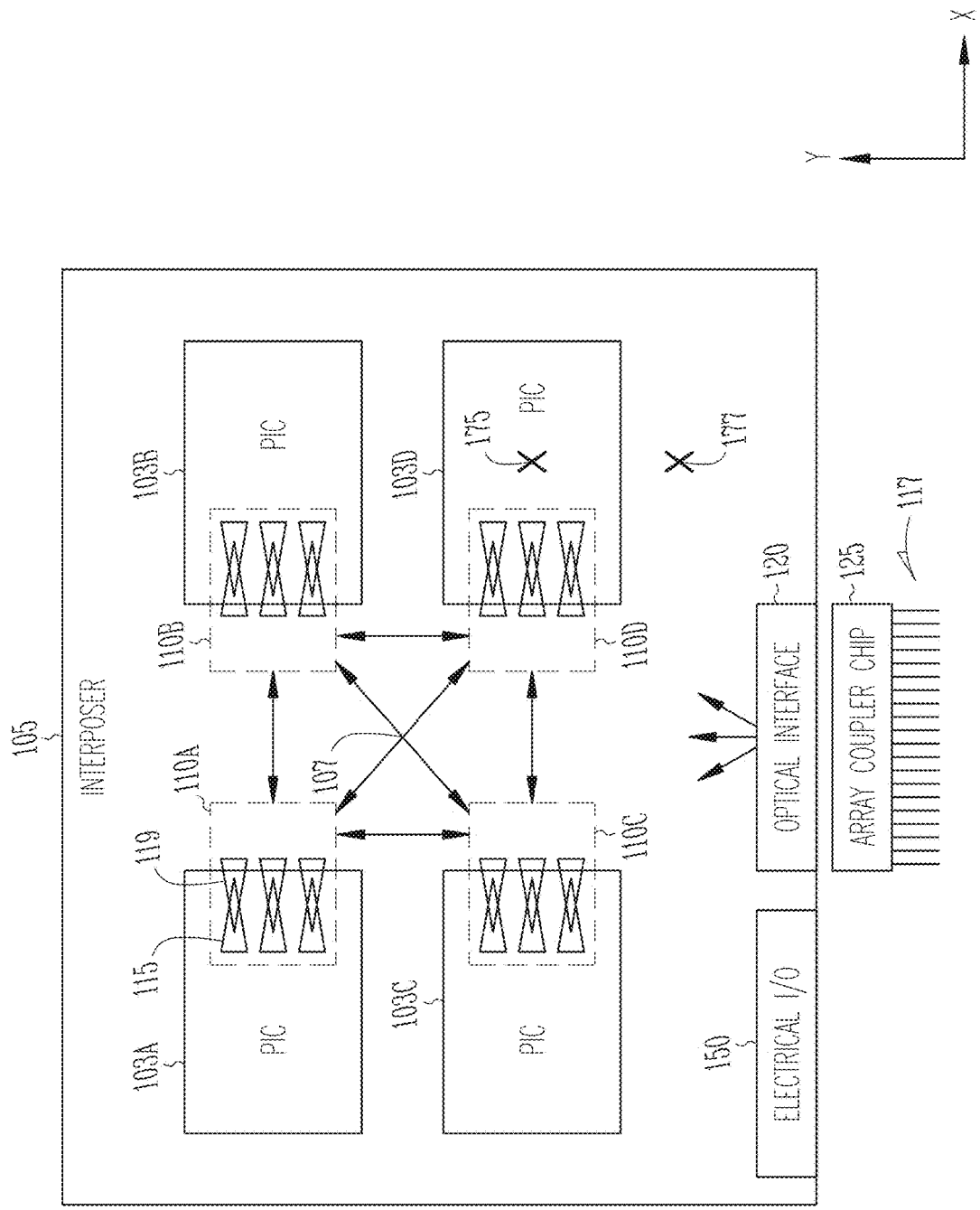
FIGS. 1A-1C show example optical interposers, in accordance with some example embodiments.

FIG. 1A shows a top-down view (X-Y plane) of an interposer 105 with multiple photonic integrated circuits, in accordance with some example embodiments. The interposer 105 optically interconnects multiple photonic integrated circuit (PICs), including PICs 103A-103D (e.g., PIC chips, chiplets connected to the interposer 105).

In accordance with some example embodiments, the interposer 105 couples light to or from the PICs 103A-103D using interposer chip optical interfaces 110A-110D. In some example embodiments, the interposer chip optical interface 110A-110D include optical couplers (e.g., tapers) that can couple light from a particular PIC to the interposer 105. In some example embodiments, the interposer chip optical interface comprises optical gratings, lens, or sets of tapers to couple the light between waveguides of the PIC chip and waveguides of the optical interposer.

For example, the interposer interface 110A comprises a first set of tapers 115 integrated in the PIC 103A that taper-in (narrow) from left-to-right (from the perspective of FIG. 1A) to adiabatically couple light from PIC 103A towards a set of second set of tapers 119 that are integrated in the interposer 105, where the second set of tapers 119 are configured such that they taper-out from left-to-right (opposite of the tapering of the first set of tapers 115), such that the light is adiabatically coupled from the PIC 103A to the interposer 105, or vice versa (from the interposer 105 to the PIC 103A).

Figure 1B:
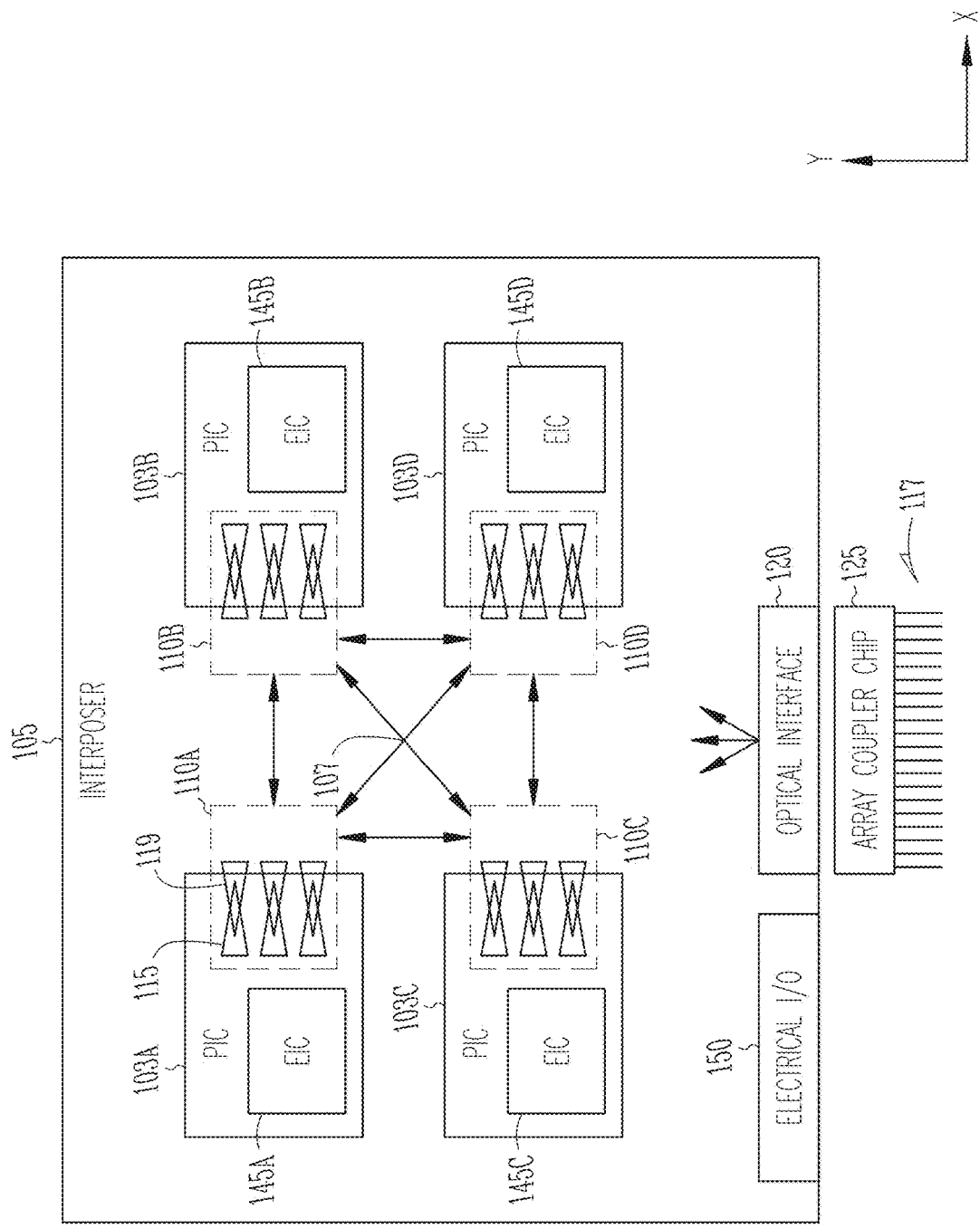
Figure 1C:
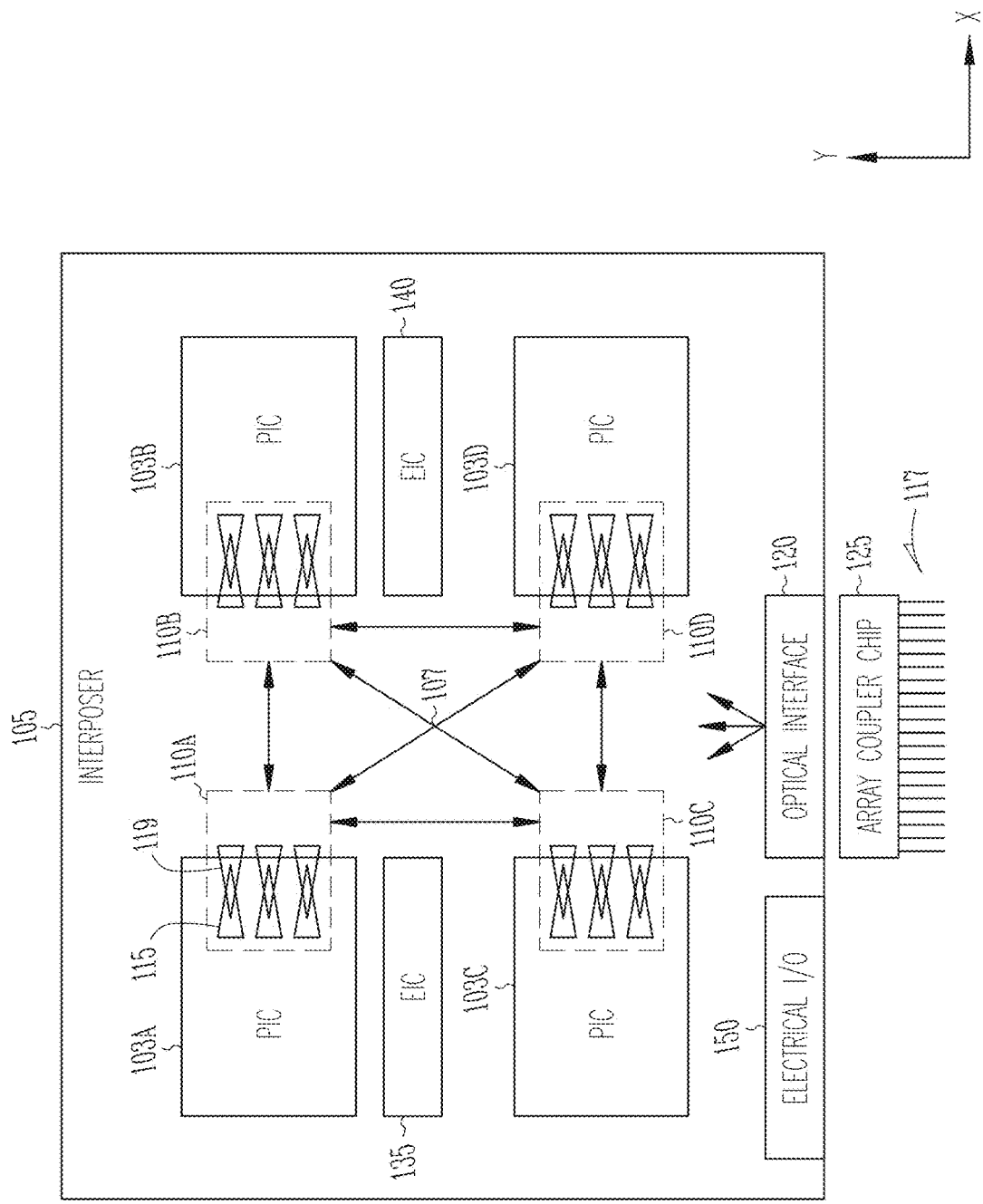

It is appreciated that the tapering-in and tapering-out directions are relative, and for light coupled from the interposer 105 to the PIC 103A the second set of tapers can be referred to as tapering-in (from right-to-left) to the first set of tapers 115 that taper out to squeeze the light to and from different levels vertically (e.g., in the Z-axis, in and out of the page), as further illustrated and discussed below from different view perspectives. In some example embodiments, the interposer 105 is itself a photonic integrated circuit comprising a plurality of waveguides to optically interconnect the different PICs 103A-103D, which is indicated in FIGS. 1A-1C by the double-headed arrows 107 interconnecting the interposer interfaces 110A to 110D of the respective PICs 103A-103D, thereby connecting the PICs 103A-103D to one another in an ultra-low loss approach, where the interposer waveguides can be designed and organized according to a given optical layout plan (e.g., optical routing network configuration).

Further, it is appreciated that additional integrated components may be integrated into the interposer 105 and interconnected with the PICs 103A-103D using the waveguides of the interposer 105. The additional interposer integrated components can include electrical components (e.g., electrical traces, contacts, capacitors, inductors), and optical components (e.g., photodetectors, optical sources, optical amplifiers, optical switches) according to the layout design of the interposer 105. In some example embodiments, the components integrated on the interposer 105 are placed using active alignment optical feedback-based approaches, or passive approaches using interlocking physical features (e.g., sockets), or by using reference markers, such as first reference marker 175 and second reference marker 177 to accurately align and attach components to the interposer 105, discussed in further detail below.

To transfer electrical signaling or light into or out of the interposer 105, the interposer 105 includes an electrical interface 150 (e.g., electrical input/output (I/O)) and an optical interface 120 (e.g., edge coupler array). The electrical interface 150 can connect external electrical wires or cables to electrical leads and traces in the interposer 105 to receive monitor signals from the components of interposer 105 and transmit control signals to the components of the interposer 105; such as electrical contacts on the PICs 103A-103D or electrical integrate circuits (EIC) chips, which are discussed in further detail below with reference to FIGS. 1B and 1C.

The optical interface 120 can couple light into and out of the interposer 105 using different couplers, such as gratings, tapers, and lenses. In some example embodiments, the optical interface 120 comprises a plurality of edge couplers that couple light using an edge of the interposer 105 to an array coupler chip 125 which further couplers the light to fibers 117 for coupling to other external devices (e.g., other optical interposer having additional PIC chiplets). In some example embodiments, the array coupler chip 125 is omitted and each of the fibers 117 is directly bonded to a waveguide port of the optical interface. For example, an end of a fiber can be aligned and bonded to a tapered-in waveguide port edge coupler of the optical interface 120, where the width of the taper at the edge of the interposer is congruent with the mode size of the fiber, thereby mode size matching the light coupled to and from the fiber to the interposer. In this way, by coupling a plurality of optical channels to the interposer, the interposer 105 functions as an optical bus to interface the devices managed by the interposer 105 to external devices.

FIGS. 1B and 1C show example embodiments of the interposer 105 in which one or more electrical integrated circuits (EIC) (e.g., EIC chips, chiplets) are interconnected with the photonic integrated components to enable electrical processing of data, in accordance with some example embodiments. FIG. 1B shows the interposer 105 with integrated PICs 103A-103D and EICs 145A-145D in a flip-chip packaged embodiment. In the configuration of FIG. 1B, the EICs 145A-145D interface electrically to a planar side of the PICs 103A-103D through electrical contacts (e.g., leads, ball-grid arrays (BGAs), pillars, vias). For example, each PIC has two planar sides that are parallel to the X-Y plane in FIGS. 1B and 1C, where a bottom planar side of a given PIC is attached to the interposer 105 and the top planar side of the given PIC has electrical interconnections to electrically connect to a given EIC which is attached to the top planar side of the given PIC.

FIG. 1C shows the interposer 105 integrated with PICs 103A-103D and EICs 145A-145D in a co-packaged embodiment, in accordance with some example embodiments. At a high level, co-packaging involves packaging photonic devices (e.g., photonic chiplets) and electronic devices (e.g., electronic chiplets) on a same silicon substrate, such as the interposer which can improve design performance (e.g., reducing coupling distance between the electrical chips and optical chips. In the example illustrated in FIG. 1C, a plurality of EICs, such as EIC 135 and EIC 140 are connected directly to the interposer 105 which has electrical interconnections (e.g., leads, traces) to electrical connect with each EIC 135 and 140.

Figure 2A:
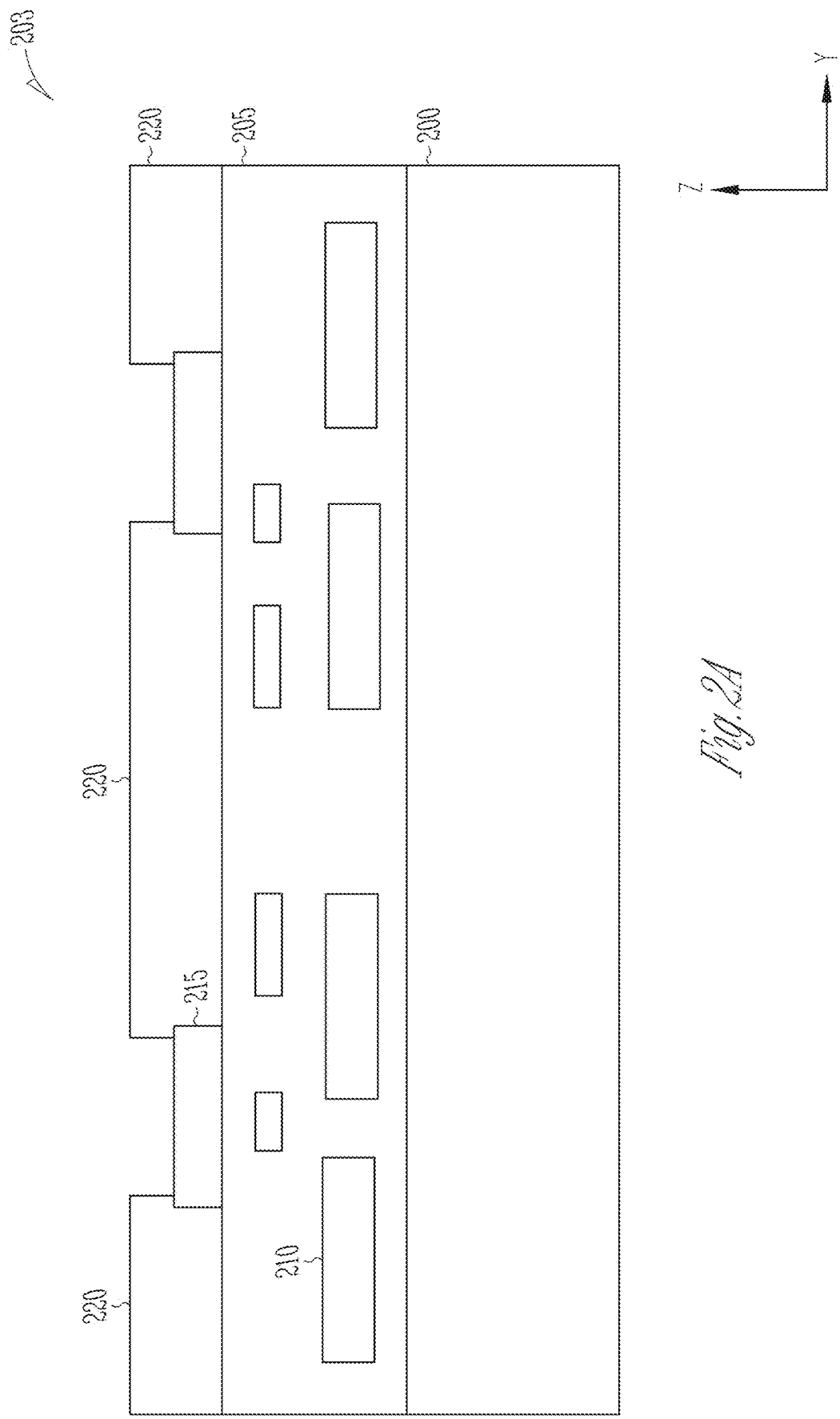

FIGS. 2A-2H show an example flow for manufacturing of an interposer structure with chiplets, in accordance with some example embodiments. FIG. 2A shows a PIC structure 203 (e.g., PIC wafer, PIC stack), in accordance with some example embodiments. The PIC structure 203 comprises layers that form a PIC chip (e.g., PIC 103A and PIC 103B, before singulation or dicing). The PIC structure 203 comprises a PIC stack substrate layer 200 (e.g., substrate material, such as silicon, glass, sapphire), a PIC stack cladding layer 205 (e.g., silicon dioxide), and one or more waveguides, such as waveguide 210 (e.g., Si waveguides, SiN waveguides) that are embedded in the PIC stack cladding layer 205.

In some example embodiments, the waveguides are formed from different sizes according to optical function and mode characteristics (e.g., wavelengths, intensity) and optical design layout (e.g., application specific photonic integrated circuit layout or schematic).

In some example embodiments the materials of the cladding layer and the waveguides are chosen such that their respective indices of refraction keep the light (e.g., bright light, quantum light, one or more photons) within the waveguides.

In some example embodiments, one or more optical components of the PIC structure 203 are controlled electrically (e.g., via electrical signaling or data from a computer or micro-controller, EIC, etc.) via application of electrical signaling or data to electrical contacts, such as electrical contact 215 (e.g., metal contact, lead, electrode).

In some example embodiments, the PIC structure 203 is formed with an oxide layer 220 as a top layer (e.g., for bonding), with trenches or holes to access the leads (e.g., for testing of the PIC at a foundry that formed the PIC structure 203).

Figure 2B:
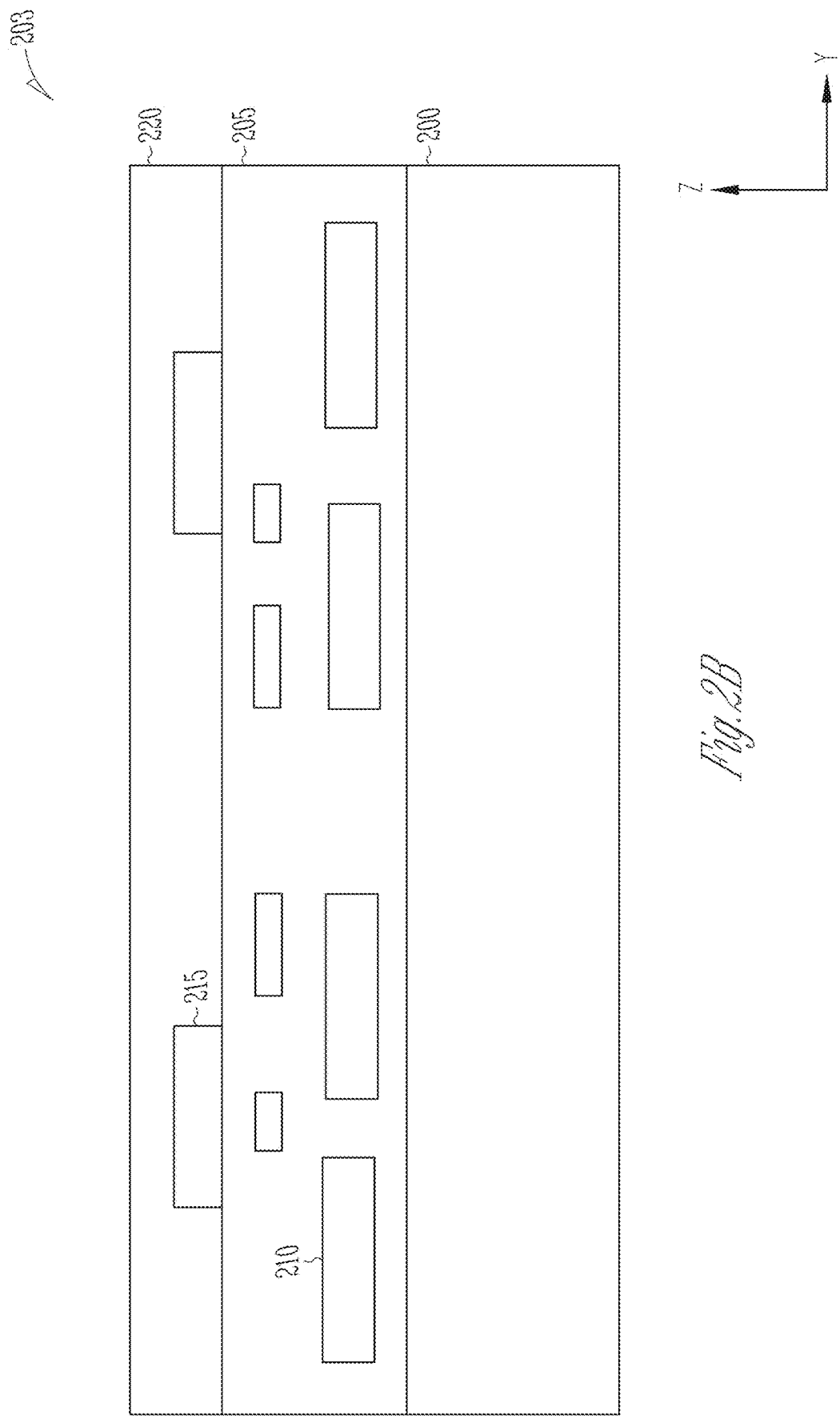

FIG. 2B shows the PIC structure 203 after further oxide material deposition to augment the oxide layer 220. Further, in some example embodiments, after further deposition of oxide material the oxide layer 220 is planarized to create a planar top surface. For example, the oxide layer can undergo oxide chemical mechanical polishing (CMP) to planarize a top layer of the oxide layer 220.

Figure 2C:
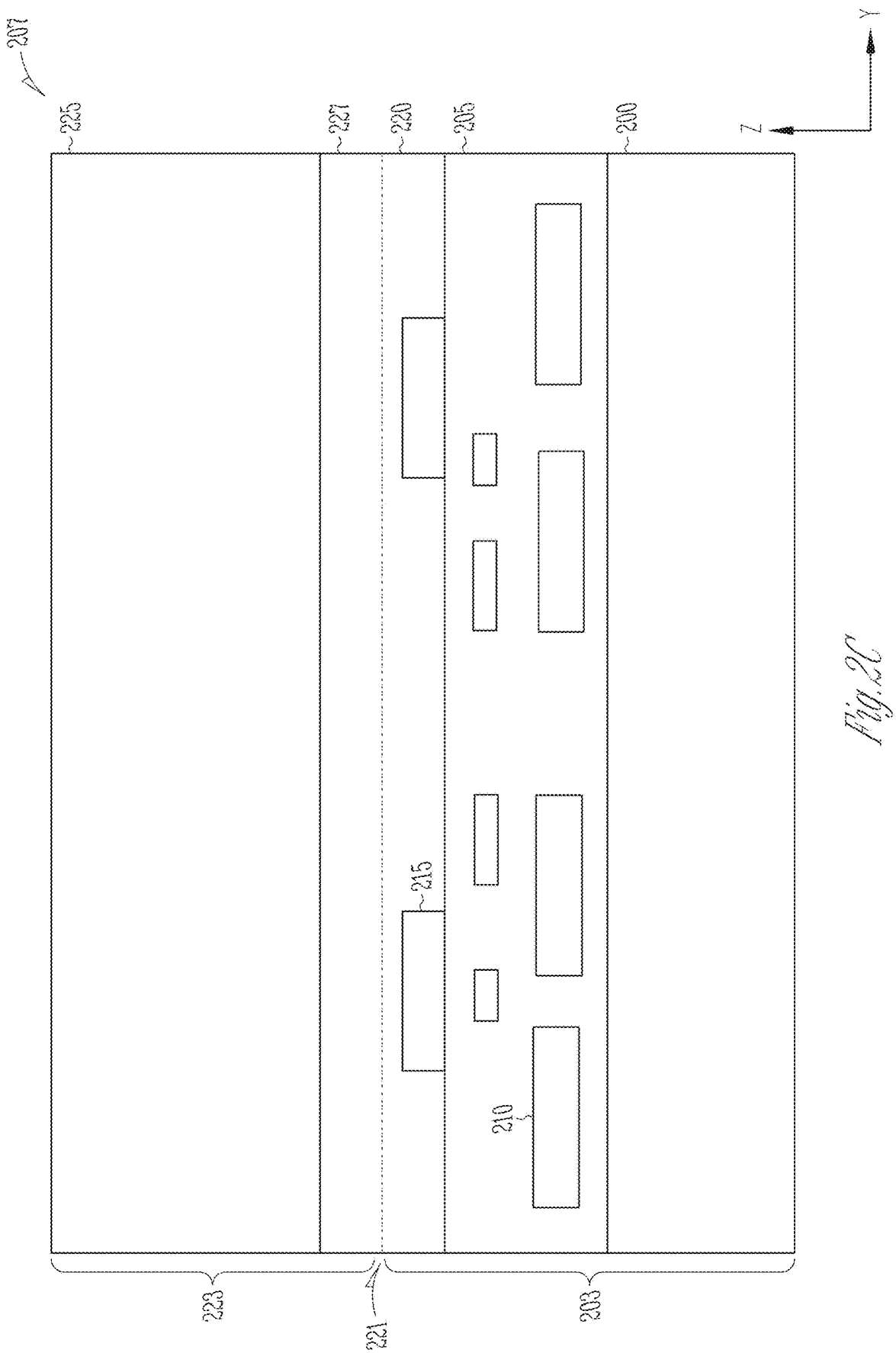

FIG. 2C shows a bonded PIC structure 207 after direct bonding the PIC structure 203 to a carrier structure 223 (e.g., carrier wafer, rigid support structure, carrier stack), in accordance with some example embodiments.

In some example embodiments, the carrier structure 223 comprises a support layer 225 (e.g., silicon substrate handle) that is rigid and provides support (luring further processing (discussed below), and a carrier oxide layer 227 that can be direct or fusion bonded to the oxide layer 220 at a bond interface 221, indicated by a dashed line that separates the carrier structure 223 and the PIC structure 203.

At a high level, direct bonding involves bonding a first wafer to a second wafer without any additional layers (e.g., without adhesives) between the two bonding surfaces of the respective wafers. In some example embodiments, each bonding surface of the respective structures-carrier structure 223 and the PIC structure 203 that are to be bonded at the bonding interface 221 are cleaned and highly polished or planarized to ensure very little to no contaminates, particles or rough features remain on either of the to-be bonded surfaces (e.g., less than 1 nanometer of surface root mean square (RMS) roughness on a given surface) such that when the two bonding surfaces are brought within close proximity, intermolecular actions (e.g., van der Waals force) attracts and bonds the surfaces together. The resulting structure is more robust and stronger than adhesive bonded wafer approaches. In some example embodiments, after initial bonding of the two surfaces, the bonding interface undergoes a low-temperature anneal to further strengthen the bond.

Figure 2D:
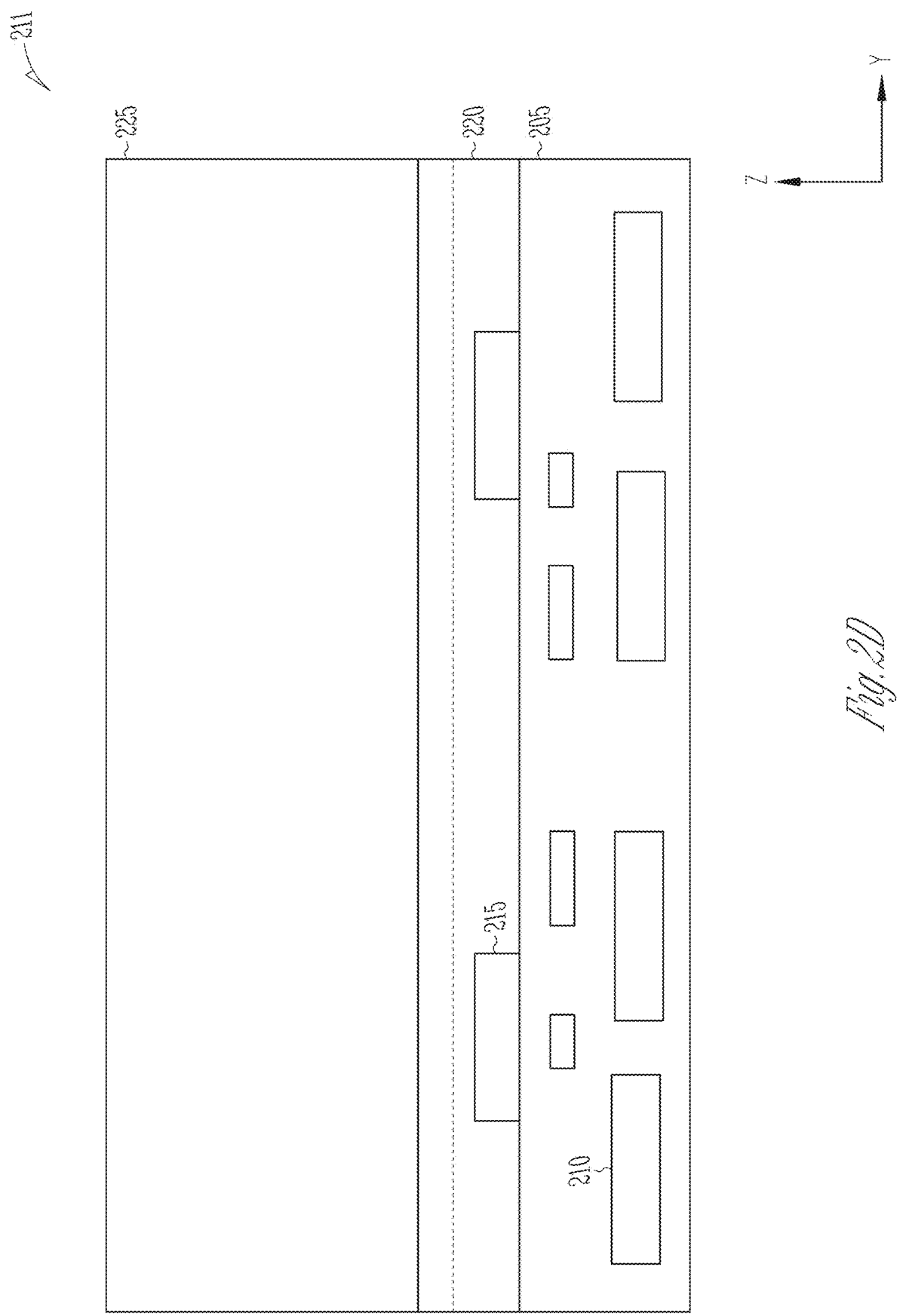

FIG. 2D shows the bonded PIC structure 211 after removal of the PIC stack substrate layer 200, in accordance with some example embodiments. The PIC stack substrate layer 200 can be removed using different processes, such as physical grinding (e.g., fine grinding, coarse grinding), chemical mechanical polishing, or etching (e.g., silicon-based etching of a silicon wafer). In some example embodiments, the removal process that is implemented is configurable to select a precise distance to stop the removal or grinding process (based on distance from a interface of two different materials, such as the (silicon dioxide) and PIC stack substrate layer 200 (silicon), or based on distance from components of a given substance or form, such a distance to the waveguides 210). As an example, the PIC stack substrate layer 200 can be removed using a silicon etching processing that is configured to etch the silicon material of the wafer and stop once the PIC stack cladding layer 205 (e.g., silicon dioxide) is encountered or within some distance of the wafer-cladding interface (e.g., stop within 1-5 microns of the interface between the PIC stack substrate layer 200 and the PIC stack cladding layer 205).

In some example embodiments, the PIC stack substrate layer 200 is removed and the cladding is thinned using a cladding removal process, such as grinding or an etching process configured for the material of the PIC stack cladding layer 205 (e.g., silicon dioxide based etching process). For instance, after first etching to remove the PIC stack substrate layer 200 using silicon based etching, additional microns of material of the PIC stack cladding layer 205 can be removed using silicon-dioxide based etching such that the waveguides 210 are close enough to the bottom side of the bonded PIC structure 211 to ensure optical coupling coupling to the interposer (e.g., classical light, quantum light, single photons, squeezed light), as discussed in in further detail below with reference to FIG. 2F to FIG. 2H.

FIG. 2E shows a carrier PIC chip 209A and a carrier PIC chip 209B (e.g., rigid PIC carrier chips), in accordance with some example embodiments. After bonding the wafers together and grinding away the substrate, the bonded PIC structure 211 (of FIG. 2D) is separated to form carrier PIC chips or dies (e.g., carrier PIC chip 209A and a carrier PIC chip 209B) which have a low-loss waveguide bonding interfaces 213 which may be delicate and easy to damage during further device manufacturing. However, due to the strength and rigid support from the carrier wafer materials, each carrier PIC chip 209A and carrier PIC chip 209B can undergo further processing to position and couple, and attach the chips to other structures in fabrication, such as an interposer. In some example embodiments, each of the different carrier PIC chips can be separated from one another using different wafer separation approaches (e.g., blade, laser, plasma dicing).

As shown, the carrier PIC chip 209A comprises a PIC stack cladding layer 205A (e.g., silicon dioxide), one or more waveguides 210A (e.g., Si waveguides, SiN waveguides) embedded in the PIC stack cladding layer 205A, electrical contact 215A, oxide layer 220A, and support layer 225A. Likewise, the carrier PIC chip 209B comprises a PIC stack cladding layer 205B (e.g., silicon dioxide), one or more waveguides 21013 (e.g., Si waveguides, SiN waveguides) embedded in the PIC stack cladding layer 205B, electrical contact 2151, oxide layer 220B, and support layer 225B.

FIG. 2F shows placement of the carrier PIC chip 209A on an interposer stack 251 (e.g., interposer wafer), in accordance with some example embodiments. In the example illustrated, the interposer stack 251 comprises a substrate layer 250 (e.g., Si wafer material), and a cladding layer 255 (e.g., silicon dioxide material) in which multiple interposer optical waveguides are embedded, such as interposer optical waveguide 260.

In some example embodiments, the interposer stack 251 has different optical characteristics or parameters that are different from the PIC wafer parameters (e.g., used to form the PIC structure 203) to ensure the interposer stack 251 exhibits ultra-low loss performance. For example, the cladding layer 255 of the interposer can include a larger buried oxide layer (e.g., larger than the buried oxide layer of the PIC stack cladding layer 205 of the PIC structure 203), to ensure higher optical confinement of the light propagating in the interposer. In some example embodiments, the interposer stack 251 is manufactured using different techniques to ensure low loss performance in the interposer, where such techniques may be incongruent with components or materials used for forming the PIC wafer and chips. For example, the interposer stack 251 may undergo a high temperature annealing process to improve optical performance of the interposer, where such high temperature anneals may degrade PIC wafer performance, or may not be available in the manufacturing environment that is used for fabricating the PIC structure 203.

In some example embodiments, the carrier PIC chips are passively aligned such that each of the waveguides of the PIC (e.g., waveguide 210A) is aligned to an intended (e.g., interposer waveguide 260). In some example embodiments the alignment processes performed passively via a placement machine (e.g., via alignment of a visible marker on the interposer, fiduciary based alignment machines) for low-loss coupling between the carrier PIC chip (e.g., carrier PIC chip 209A) and the interposer stack 251 without using active alignment optics.

For example, with reference to FIG. 1A, a first reference marker 175 can be formed on PIC 103D during fabrication or post-processing of the PIC 103D (e.g., PIC stack or wafer processing), and a second reference marker 177 can likewise be formed on the interposer 105 (e.g., interposer stack processing), for alignment of chips to wafer. For example, a die placement machine (not depicted) may have an assembly head that pics up the PIC 103D and places it on the interposer 105 such that the waveguides of the PIC 103D and the interposer 105 are aligned. In some example embodiments, the die placement machine (e.g., pick and place machine) can include cameras that image the first reference marker 175 and the second reference marker 177 to determine distances for placement such that PIC 103D can be placed on the interposer 105 in a highly accurate and efficient passive manufacturing approach (e.g., within a few micrometers, within hundreds of micrometers).

With reference to FIG. 2F, after placement of the carrier PIC chip 209A, the carrier PIC chip 209A is bonded to the interposer stack 251. For example, the carrier PIC chip 209A can be bonded to the interposer stack 251 using an adhesive or direct bonding of the PIC stack cladding layer 205A to the cladding layer 255.

FIG. 2G illustrates removal of the carrier PIC material using chip-on-wafer grinding, in accordance with some example embodiments. In the illustrated example, after the carrier PIC chip 209A is bonded to the wafer, a portion of the carrier material layer 225A of the carrier PIC chip 209A is partially removed via coarse grinding such that further removal and refinement can be performed using fine grinding or other material removal techniques. Although only one pie structure (carrier PIC chip 209A) is shown in the illustrated example of FIG. 2G, it is appreciated that a plurality of PIC structures can be aligned and attached to the interposer stack 251, and the carrier material of each of the placed carrier PICs is removed in the same process (e.g., a single grinding surface is in contact with and grinds away each top-side of the respective carrier PIC chips), in accordance with some example embodiments Further, in some example embodiments, a plurality of PIC structures can be aligned and attached to the interposer stack 251 and sets of the PIC structures are processed to remove the carrier layer material (e.g., removing carrier material from three PIC structures using a grinding/polishing/etching tool of a smaller size, followed by removal of a next set of three PIC structures on the interposer to remove their respective portions of carrier material and so on).

Figure 2H:
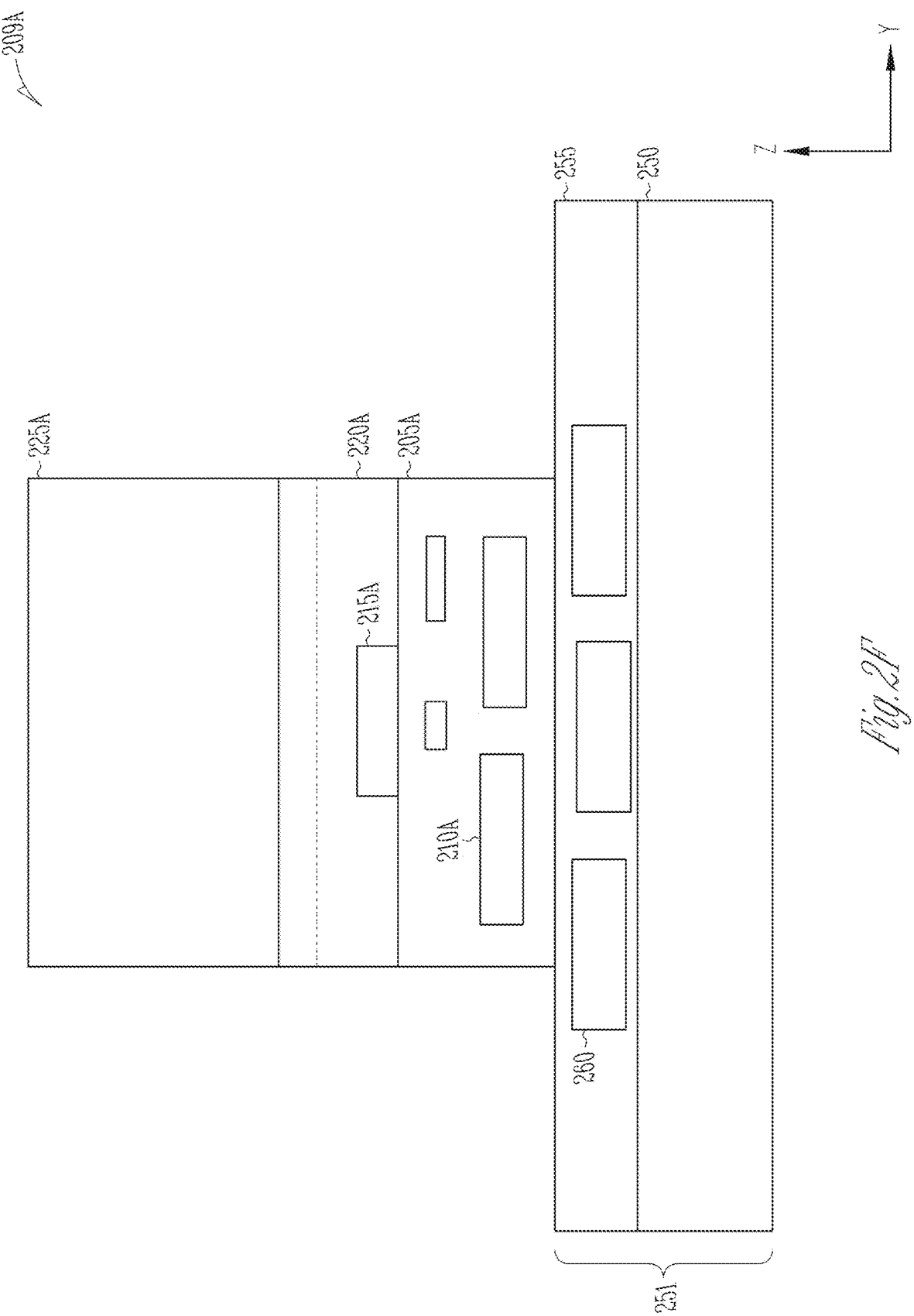
Figure 2H:
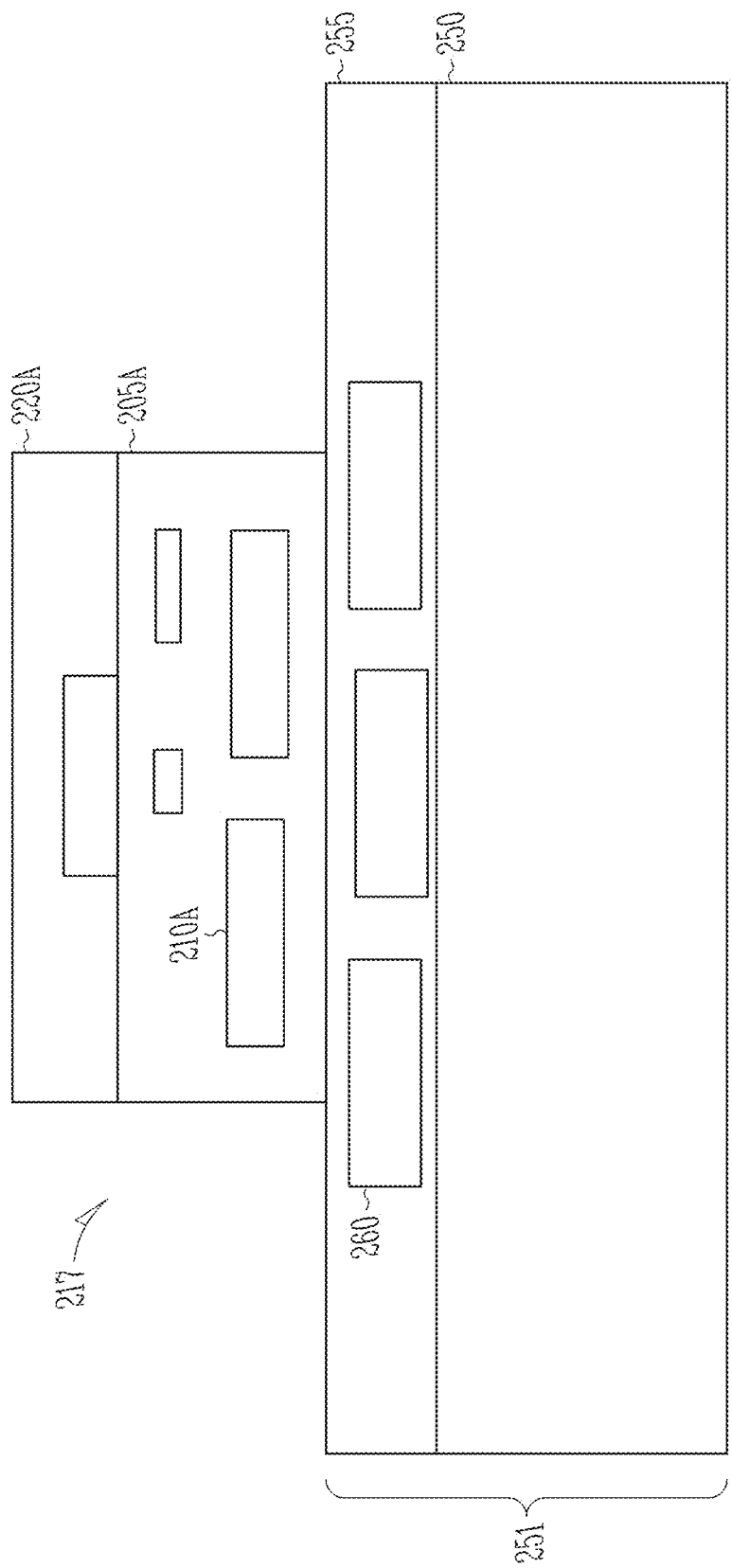

FIG. 2H shows the PIC 217 on the interposer with carrier portions removed, in accordance with some example embodiments. In the illustrated example, the remaining carrier material layer 225A of carrier PIC chip 209A of FIG. 2G is further removed (e.g., grinding, polishing, etching) to form the PIC 217 (e.g., the PIC 103A). It is appreciated through although only a single carrier PIC chip is shown bonded to the interposer stack 251 in the FIGS. 2F-2H, each of the PICs of the wafer can be bonded in a similar manner to the interposer stack 251.

Further, in some example embodiments, each of the carrier PICs bonded to the wafer are from the same PIC wafer (e.g., having the same layers). Further, in accordance with some example embodiments, PICs of different types (e.g., different layering or different stacked materials) can be bonded to the interposer stack 251 in a similar manner so long as the PIC stack can be carrier bonded (e.g., oxide to oxide bonding). For example, a first PIC stack comprising a substrate, cladding with silicon waveguides can comprise a first stack that forms a first PIC carrier bonded to the interposer and a second PIC stack having exotic cryogenic materials can likewise be bonded to a PIC to form a PIC carrier then bonded to the interposer stack 251.

Figure 3B:
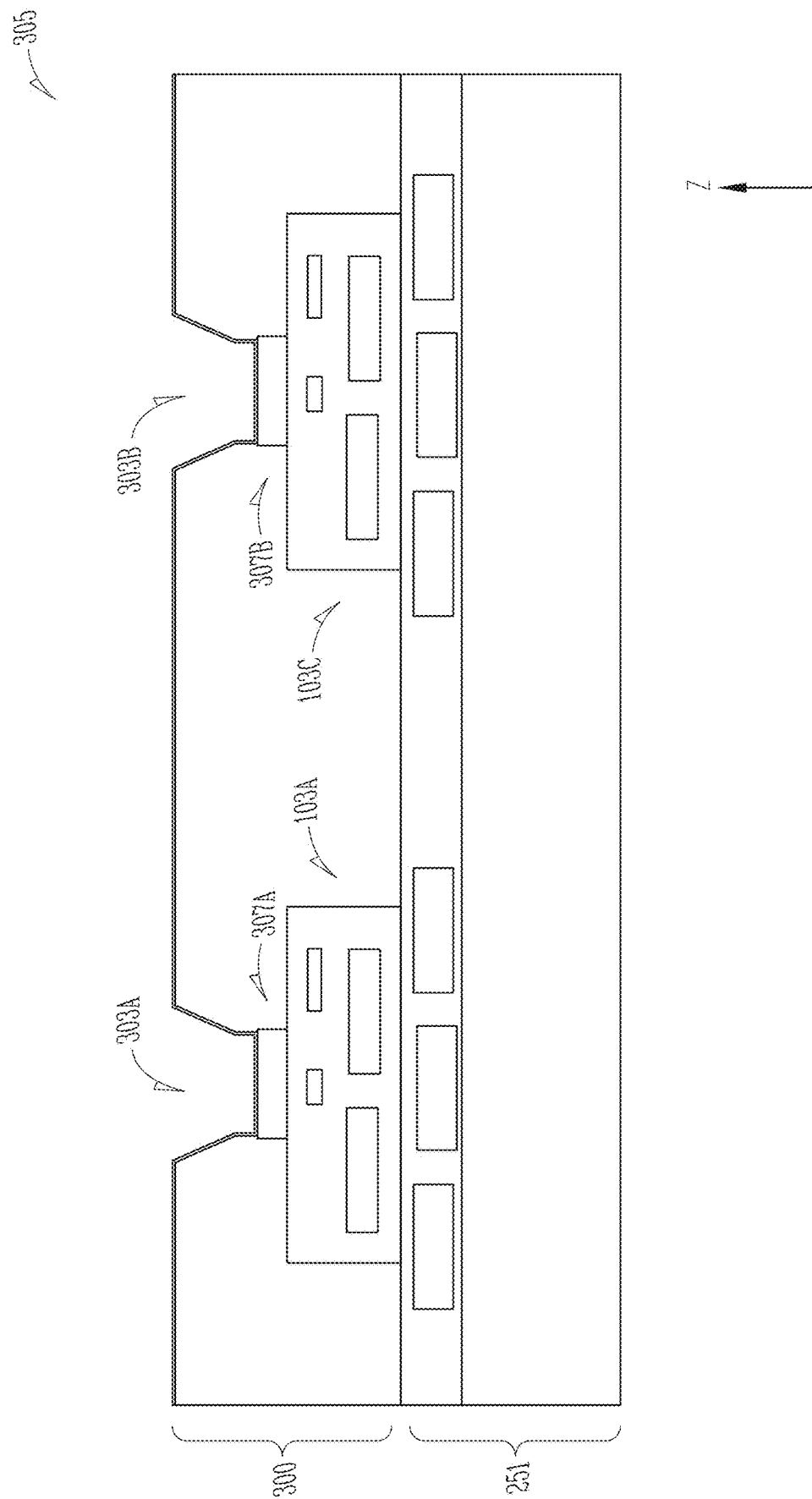

FIGS. 3A-3D show examples fabrication approaches for forming a PIC interposer 305 with PIC chiplets (e.g., interposer 105), in accordance with some example embodiments. In FIG. 3A, multiple PICs, such as the PIC 103A and the PIC 103C have been bonded to the interposer stack 251, as discussed above with reference to FIGS. 2A-2H. Further, an oxide fill step fills the space between the PICs to create an interposer oxide layer 300. In some example embodiments, after the oxide fill, the top-side of the oxide layer 300 (from the perspective of FIG. 3A) is planarized (e.g., CMP processing).

In FIG. 3B, access 303A and 303B to the leads 307A and 307B of the PICs are created, for example through etching or photolithography. Further illustrated in FIG. 3B, a seed layer is deposited for metal processing (e.g., metal leads, traces, ball grids, contacts, galvanic deposition).

Figure 3C:
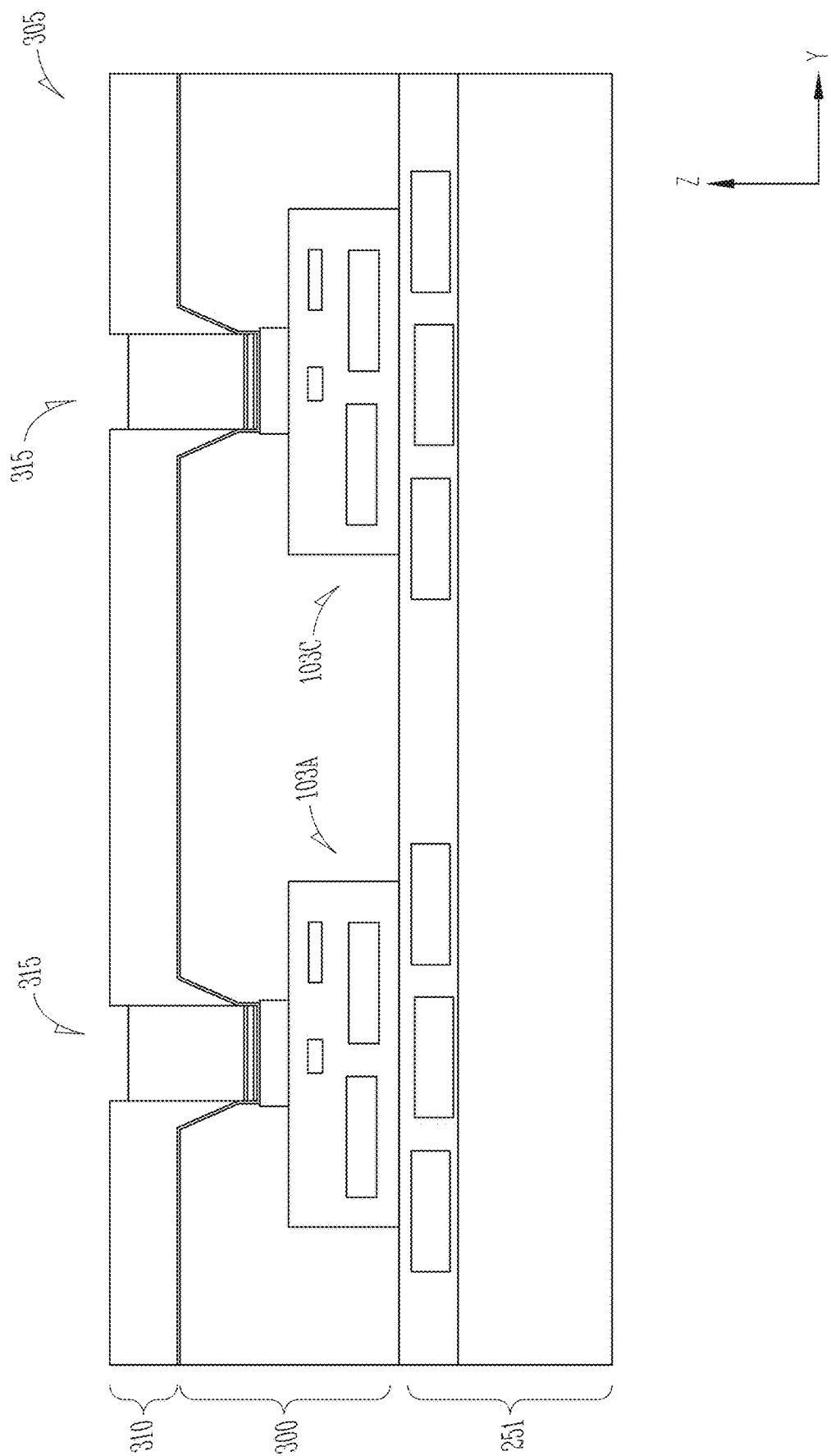

In FIG. 3C, a photoresist layer 310 is patterned and metal 315 (e.g., copper, Nickel-Indium alloy) is added to fill the access 303A and 303B (shown in FIG. 3A) to the leads. FIG. 3D shows the interposer 305 structure after further processing, including photoresist stripping, seed etching, and soldering to form contacts 320A and 320B. For example, the contacts 320A and 320B can include pillars, balls of a ball gride array and so forth, which can be electrically connected to metal interconnects or EICs (e.g., in a flip-chip configuration).

FIG. 4A-E shows an alternative approach for manufacturing a low loss interposer (e.g., interposer 105), in accordance with some example embodiments. In FIGS. 2A to 3D, the metal contacts of to the PIC chiplets are formed after the chiplets are attached to the interposers, whereas in the approach of FIGS. 4A-4E, the metal contacts are implemented as vias (e.g., through oxide vias (TOVs), through silicon vias (TSVs) that are integrated on the carrier PIC chips during the fabrication of the carrier PIC chips, which are then aligned and placed on an interposer structure, and the PIC chips respective topsides are removed (e.g., grinding, etching, CMP) to expose portions of the vias which function as integrated metal contacts for the PIC chiplets.

Figure 4A:
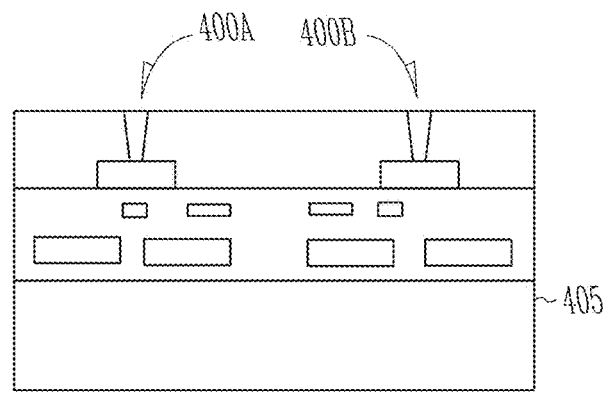
FIGS. 4A-4E show examples for forming interposers with integrated electrical contacts, in accordance with some example embodiments.

In particular, in FIG. 4A metal vias 400A and 400B are implanted into an oxide layer to connect to the leads of the PIC wafer 405. In the illustrated example, the vias 400A and 400B are through oxide vide (TOVs), however, in some example embodiments, an oxide layer is replaced with silicon layer and the vias are through silicon vias (TSVs).

Figure 4B:
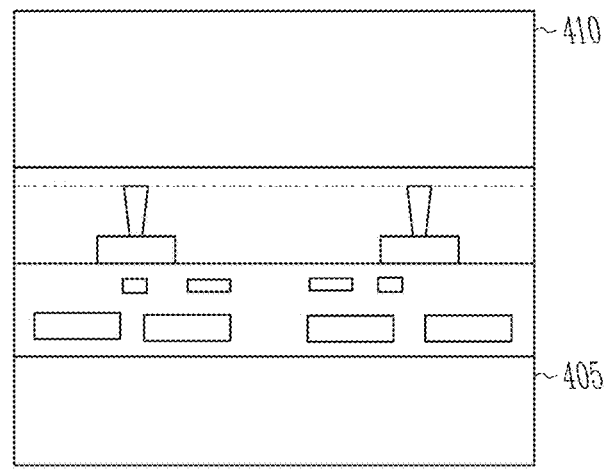
Figure 4C:
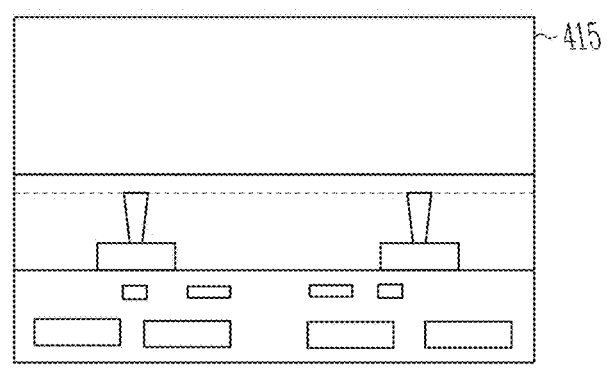

In FIG. 4B the PIC wafer is bonded to a carrier wafer 410, as discussed above with reference to FIG. 2C. FIG. 4C shows a bonded structure 415 after removal of bottom-side substrate material of the PIC wafer 405 such that the waveguides can couple to the interposer.

Figure 4D:
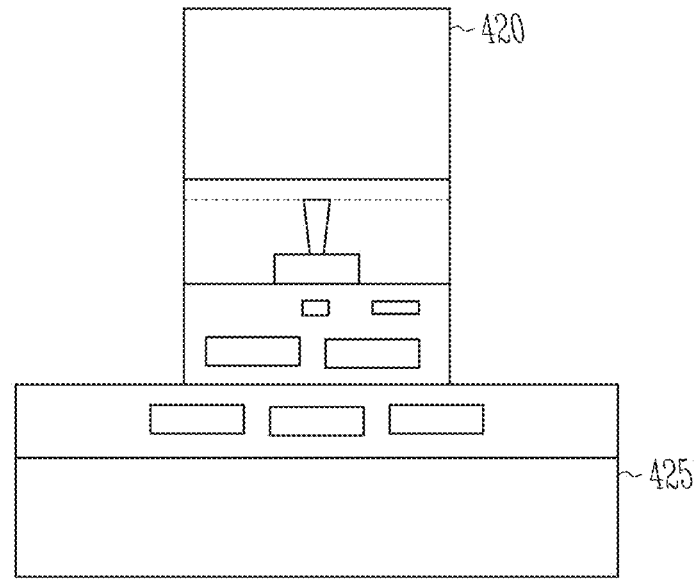
Figure 4E:
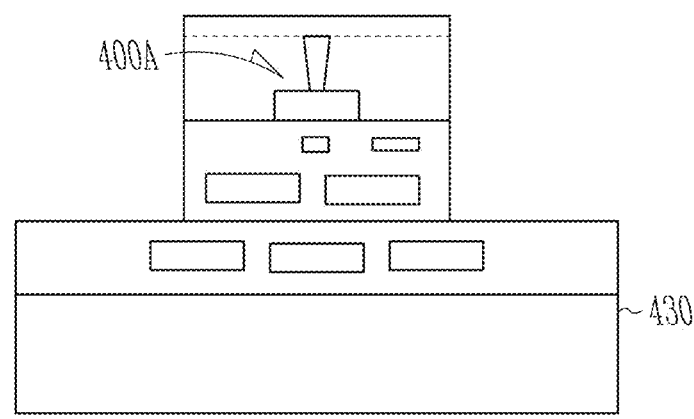

FIG. 4D shows a singulated bonded structure 420 (e.g., carrier PIC die with an integrated via) which is formed by singulating bonded structure 415 of FIG. 4C. FIG. 4D further illustrates placement of the chip structure 420 on an interposer structure 425 (e.g., interposer wafer) having waveguides and a substrate, as discussed above (e.g., interposer stack 251, FIG. 2F).

FIG. 4-E shows an interposer structure 430 having an integrated PIC chiplet that has a via already integrated for electrical contact (e.g., to an EIC, or electrical wire for connection to other external components). For example, after placement of the structure 420 on the interposer structure 425 (e.g., using passive alignment), the support material is removed by way of grinding, etching, or CMP such that the top end of the via 400A is accessible and functions as an electrical contact for the PIC chip. In some example embodiments, due to the metal contacts (vias) already being integrated on each PIC chiplet, less carrier support material is removed (e.g., in FIG. 4D), as compared to the the amount of carrier material removed in the process shown in FIGS. 2G and 2F. As such, integrating vias in the PIC carrier chips using the processing of FIGS. 4A-4E may be more congruent with a given optical interposer layout design (e.g., high PIC chiplet quantity) or more practical to implement in a given manufacturing plants available processing and fabrication techniques.

Figure 5:
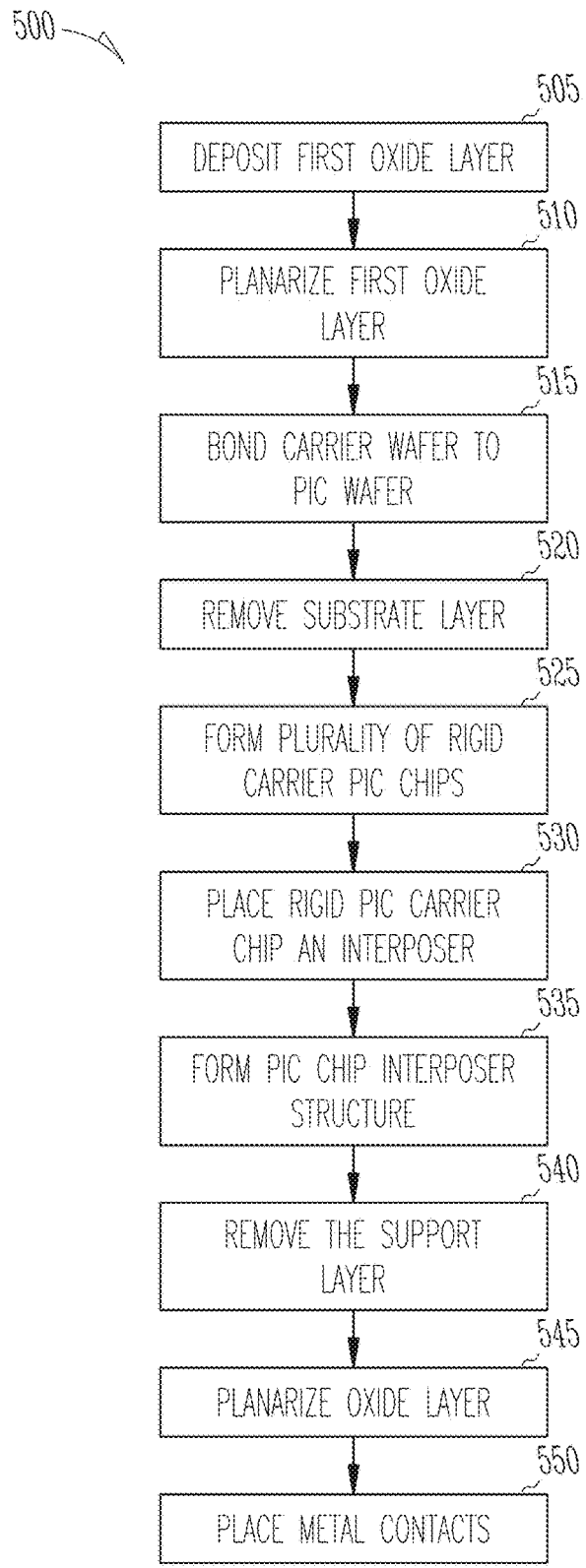
FIG. 5 shows a flow diagram of an example method for manufacturing interposers, in accordance with some example embodiments.

FIG. 5 is a flowchart of a method 500 for fabricating an optical interposer, in accordance with some example embodiments. In some implementations, one or more process blocks of FIG. 5 may be performed by a device. As shown in FIG. 5, method 500 may include depositing a first oxide layer on a photonic integrated circuit (PIC) wafer, the PIC wafer having a substrate layer and a PIC waveguide layer, the PIC waveguide layer having a plurality of PIC waveguides, the first oxide layer being deposited on the PIC waveguide layer (block 505). For example, device may deposit a first oxide layer on a photonic integrated circuit (pic) wafer, the pic wafer having a substrate layer and a pic waveguide layer, the pic waveguide layer having a plurality of pic waveguides, the first oxide layer being deposited on the pie waveguide layer, as described above.

As also shown in FIG. 5, method 500 may include planarizing the first oxide layer, where the planarizing may include performing chemical mechanical polishing of an exposed side of the first oxide layer (block 510). For example, device may planarize the first oxide layer, where the planarizing may include performing chemical mechanical polishing of an exposed side of the first oxide layer, as described above. As further shown in FIG. 5, method 500 may include direct bonding a carrier wafer to the PIC wafer to form a rigid bonded wafer, where the carrier wafer may include a support layer and a second oxide layer, where direct bonding may include bonding a first bonding side of the first oxide layer to a second bonding side of the second oxide layer, where the first bonding side of the first oxide layer is bonded to the second bonding side of the second bonding layer without an adhesive, where the first bonding side of the first oxide layer is bonded to the second bonding side of the second bonding layer without intermediate layers separating the first oxide layer to the second oxide layer, where in direct bonding a plurality of first molecules of the first oxide layer and a plurality of second molecules of the second oxide layer are molecularly attracted to each other to bond to each other, where in direct bonding a plurality of first molecules of the first oxide layer and a plurality of second molecules of the second oxide layer are attracted to each other to bond to each other at least in part due to van der Waals forces (block 515). For example, device may direct bond a carrier wafer to the pic wafer to form a rigid bonded wafer, where the carrier wafer may include a support layer and a second oxide layer, where direct bonding may include bonding a first bonding side of the first oxide layer to a second bonding side of the second oxide layer, where the first bonding side of the first oxide layer is bonded to the second bonding side of the second bonding layer without an adhesive, where the first bonding side of the first oxide layer is bonded to the second bonding side of the second bonding layer without intermediate layers separating the first oxide layer to the second oxide layer, where in direct bonding a plurality of first molecules of the first oxide layer and a plurality of second molecules of the second oxide layer are molecularly attracted to each other to bond to each other, where in direct bonding a plurality of first molecules of the first oxide layer and a plurality of second molecules of the second oxide layer are attracted to each other to bond to each other at least in part due to van der Waals forces, as described above. As also shown in FIG. 5, method 500 may include removing the substrate layer from the rigid bonded wafer, where the substrate layer is removed using grinding, where the substrate layer is removed using chemical mechanical polishing (block 520). For example, device may remove the substrate layer from the rigid bonded wafer, where the substrate layer is removed using grinding, where the substrate layer is removed using chemical mechanical polishing, as described above. As further shown in FIG. 5, method 500 may include singulating the rigid bonded wafer to form a plurality of carrier PIC chips, where a carrier PIC chip of the plurality of carrier PIC chips may include a portion of the support layer from the carrier wafer and a portion of the PIC waveguide layer from the PIC wafer, where the portion of the PIC waveguide layer from the PIC wafer may include a portion of the plurality of PIC waveguides of PIC wafer (block 525). For example, device may singular the rigid bonded wafer to form a plurality of carrier PIC chips, where a rigid pic carrier chip of the plurality of carrier PIC chips may include a portion of the support layer from the carrier wafer and a portion of the pic waveguide layer from the pic wafer, where the portion of the pic waveguide layer from the PIC wafer may include a portion of the plurality of PIC waveguides of pic wafer, as described above.

As also shown in FIG. 5, method 500 may include positioning the rigid PIC carrier chip on an interposer wafer, where the interposer wafer may include an interposer substrate layer and an interposer waveguide layer on the interposer substrate layer, where the interposer waveguide layer may include a plurality of interposer waveguides (block 530). For example, device may position the rigid PIC carrier chip on an interposer wafer, where the interposer wafer may include an interposer substrate layer and an interposer waveguide layer on the interposer substrate layer, where the interposer waveguide layer may include a plurality of interposer waveguides, as described above. As further shown in FIG. 5, method 500 may include bonding the rigid PIC carrier chip to the interposer wafer to form a PIC chip interposer structure, where the PIC waveguide layer of the PIC is bonded to the interposer waveguide layer, where the rigid PIC carrier chip is bonded to the interposer wafer using alignment of physical markers on at least one or more of the rigid PIC carrier chip or the interposer wafer, where one or more waveguides of the plurality of PIC waveguides in the rigid PIC carrier chip are aligned with one or more of the interposer waveguides such that the one or more waveguides are optically coupled and light can transmit between the rigid PIC carrier chip and interposer wafer (block 535). For example, device may bond the rigid pic carrier chip to the interposer wafer to form a PIC chip interposer structure, where the PIC waveguide layer of the PIC is bonded to the interposer waveguide layer, where the rigid PIC carrier chip is bonded to the interposer wafer using alignment of physical markers on at least one or more of: the rigid PIC carrier chip or the interposer wafer, where one or more waveguides of the plurality of PIC waveguides in the rigid PIC carrier chip are aligned with one or more of the interposer waveguides such that the one or more waveguides are optically coupled and light can transmit between the rigid PIC carrier chip and interposer wafer, as described above.

As also shown in FIG. 5, method 500 may include removing the support layer from the PIC chip interposer structure, where the support layer is removed by grinding the support layer of the PIC chip interposer structure, where the removing of the support layer exposes an oxide layer (block 540). For example, device may remove the support layer from the PIC chip interposer structure, where the support layer is removed by grinding the support layer of the PIC chip interposer structure, where the removing of the support layer exposes an oxide layer, as described above. As further shown in FIG. 5, method 500 may include planarizing the oxide layer, where the oxide layer is planarized using chemical mechanical polishing (block 545). For example, device may planarize the oxide layer, where the oxide layer is planarized using chemical mechanical polishing, as described above.

Further shown in FIG. 5, the method 500 may include, at operation 550, placing metal contacts (e.g., leads, pillars, vias). In some example embodiments, the operation 550 can be performed after the PIC chiplets are integrated on the interposer structure as discussed with reference to FIGS. 3B to 3D. Further, in some example embodiments, the operation 550 is performed during fabrication of PIC chiplets before they are attached to the interposer structure, as discussed with reference to FIGS. 4A-4D above.

Although FIG. 5 shows example blocks of method 500, in some implementations, method 500 may include additional blocks, fewer blocks, different blocks, or differently arranged blocks than those depicted in FIG. 5. Additionally, or alternatively, two or more of the blocks of method 500 may be performed in parallel.

The following are example embodiments:

Example 1: A method comprising: depositing a first oxide layer on a photonic integrated circuit (PIC) wafer, the PIC wafer comprising a substrate layer and a PIC waveguide layer, the PIC waveguide layer comprising a plurality of PIC waveguides, the first oxide layer being deposited on the PIC waveguide layer; planarizing the first oxide layer; bonding a carrier wafer to the PIC wafer to form a rigid bonded wafer, wherein the carrier wafer comprises a support layer; removing the substrate layer from the rigid bonded wafer; singulating the rigid bonded wafer to form a plurality of carrier PIC chips; positioning the rigid PIC carrier chip on an interposer wafer, the interposer wafer comprising an interposer substrate layer and an interposer waveguide layer on the interposer substrate layer, the interposer waveguide layer comprising a plurality of interposer waveguides; bonding the rigid PIC carrier chip to the interposer wafer to form a PIC chip interposer structure; removing the support layer from the PIC chip interposer structure, wherein the removing of the support layer exposes an oxide layer; planarizing the oxide layer, wherein the oxide layer is planarized using chemical mechanical polishing.

Example 2: The method of Example 1, wherein the planarizing comprises performing chemical mechanical polishing of an exposed side of the first oxide layer.

Example 3: The method of Example 1 or Example 2, wherein the carrier wafer comprises a second oxide layer.

Example 4: The method of any one of Examples 1-3, wherein bonding comprises direct bonding a first bonding side of the first oxide layer to a second bonding side of the second oxide layer.

Example 5: The method of any one of Examples 1-4, wherein the first bonding side of the first oxide layer is bonded to the second bonding side of the second bonding layer without an adhesive.

Example 6: The method of any one of Examples 1-5, wherein the first bonding side of the first oxide layer is bonded to the second bonding side of the second bonding layer without intermediate layers separating the first oxide layer to the second oxide layer.

Example 7: The method of any one of Examples 1-6, wherein the substrate layer is removed using grinding, wherein the substrate layer is removed using chemical mechanical polishing.

Example 8: The method of any one of Examples 1-7, wherein a rigid PIC carrier chip of the plurality of carrier PIC chips comprises a portion of the support layer from the carrier wafer and a portion of the PIC waveguide layer from the PIC wafer, wherein the portion of the PIC waveguide layer from the PIC wafer comprises a portion of the plurality of PIC waveguides of PIC wafer.

Example 9: The method of any one of Examples 1-8, wherein the PIC waveguide layer of the PIC is bonded to the interposer waveguide layer.

Example 10: The method of any one of Examples 1-9, wherein the rigid PIC carrier chip is bonded to the interposer wafer using alignment of physical markers on at least one or more of: the rigid PIC carrier chip or the interposer wafer.

Example 11: The method of any one of Examples 1-10, wherein one or more waveguides of the plurality of PIC waveguides in the rigid PIC carrier chip are aligned with one or more of the interposer waveguides such that the one or more waveguides are optically coupled and light can transmit between the rigid PIC carrier chip and interposer wafer.

Example 12: The method of any one of Examples 1-11, wherein the rigid PIC carrier chip is a first rigid PIC carrier chip, wherein the plurality of rigid carrier PIC dies further comprises a second rigid PIC carrier die, and wherein the method further comprises: positioning the second rigid PIC carrier on the PIC chip interposer structure such that PIC waveguides in the second rigid PIC carrier are aligned with one or more interposer waveguides from the interposer wafer; bonding the second rigid PIC carrier chip on the PIC chip interposer structure; removing an additional support layer portion from the PIC chip interposer structure, wherein the additional support layer portion is removed by grinding the additional support layer portion of the PIC chip interposer structure, wherein the removing of the support layer exposes a further oxide layer; and planarizing the further oxide layer.

Example 13: The method of any one of Examples 1-12, further comprising: depositing oxide material to form an interposer oxide layer over the first rigid PIC carrier chip, the second rigid PIC carrier chip, and portions of the interposer wafer.

Example 14: The method of any one of Examples 1-13, wherein the support layer is removed by grinding the support layer of the PIC chip interposer structure.

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of the method 500 may be performed by one or more processors. The performance of certain of the operations may be distributed among the one or more processors, not only residing within a single machine, but also deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A method comprising:
   depositing a first oxide layer on a photonic integrated circuit (PIC) wafer, the PIC wafer comprising a substrate layer and a PIC waveguide layer, the PIC waveguide layer comprising a plurality of PIC waveguides, the first oxide layer being deposited on the PIC waveguide layer;
   planarizing the first oxide layer;
   bonding a carrier wafer to the PIC wafer to form a bonded wafer, the carrier wafer comprising a support layer;
   removing the substrate layer from the bonded wafer;
   singulating the bonded wafer to form a plurality of carrier PIC chips;
   positioning the PIC carrier chip on an interposer wafer, the interposer wafer comprising an interposer substrate layer and an interposer waveguide layer on the interposer substrate layer, the interposer waveguide layer comprising a plurality of interposer waveguides;
   bonding the PIC carrier chip to the interposer wafer to form a PIC chip interposer structure;
   removing the support layer from the PIC chip interposer structure, wherein the removing of the support layer exposes an oxide layer; and
   planarizing the oxide layer, wherein the oxide layer is planarized using chemical mechanical polishing.

2. The method of claim 1, wherein the planarizing comprises performing chemical mechanical polishing of an exposed side of the first oxide layer.

3. The method of claim 1, wherein the carrier wafer comprises a second oxide layer.

4. The method of claim 3, wherein bonding comprises direct bonding a first bonding side of the first oxide layer to a second bonding side of the second oxide layer.

5. The method of claim 4, wherein the first bonding side of the first oxide layer is bonded to the second bonding side of the second oxide layer without an adhesive.

6. The method of claim 4, wherein the first bonding side of the first oxide layer is bonded to the second bonding side of the second oxide layer without intermediate layers separating the first oxide layer to the second oxide layer.

7. The method of claim 1, wherein the substrate layer is removed using grinding.

8. The method of claim 1, wherein the substrate layer is removed using chemical mechanical polishing.

9. The method of claim 1, wherein a PIC carrier chip of the plurality of carrier PIC chips comprises a portion of the support layer from the carrier wafer and a portion of the PIC waveguide layer from the PIC wafer, wherein the portion of the PIC waveguide layer from the PIC wafer comprises a portion of the plurality of PIC waveguides of PIC wafer.

10. The method of claim 9, wherein the PIC waveguide layer of the PIC is bonded to the interposer waveguide layer.

11. The method of claim 10, wherein the PIC carrier chip is bonded to the interposer wafer using alignment of physical markers on at least one or more of: the PIC carrier chip or the interposer wafer.

12. The method of claim 11, wherein one or more waveguides of the plurality of PIC waveguides in the PIC carrier chip are aligned with one or more of the interposer waveguides such that the one or more waveguides are optically coupled and light can transmit between the PIC carrier chip and interposer wafer.

13. The method of claim 10, wherein the PIC carrier chip is a first PIC carrier chip, wherein the plurality of carrier PIC chips further comprises a second PIC carrier chip, and wherein the method further comprises:
    positioning the second PIC carrier chip on the PIC chip interposer structure such that PIC waveguides in the second PIC carrier chip are aligned with one or more interposer waveguides from the interposer wafer;
    bonding the second PIC carrier chip on the PIC chip interposer structure;
    removing an additional support layer portion from the PIC chip interposer structure, wherein the additional support layer portion is removed by grinding the additional support layer portion of the PIC chip interposer structure, wherein the removing of the support layer exposes a further oxide layer; and
    planarizing the further oxide layer.

14. The method of claim 13, further comprising:
    depositing oxide material to form an interposer oxide layer over the first PIC carrier chip, the second PIC carrier chip, and portions of the interposer wafer.

15. The method of claim 1, wherein the support layer is removed by grinding the support layer of the PIC chip interposer structure.

16. The method of claim 15, wherein respective carrier layers of each of the plurality of carrier PIC chips is removed, in a same process.

* * * * *